United States Patent
Morin et al.

(10) Patent No.: US 11,271,220 B2
(45) Date of Patent: Mar. 8, 2022

(54) MULTILAYER STRUCTURE INCORPORATING A MAT OF CARBON NANOTUBES AS DIFFUSION LAYER IN A PEMFC

(71) Applicant: COMMISSARIAT A L'ENERGIE ATOMIQUE ET AUX ENERGIES ALTERNATIVES, Paris (FR)

(72) Inventors: Arnaud Morin, Corenc (FR); Jean Dijon, Champagnier (FR); Raphael Ramos, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 256 days.

(21) Appl. No.: 16/165,277

(22) Filed: Oct. 19, 2018

(65) Prior Publication Data

US 2019/0123359 A1    Apr. 25, 2019

(30) Foreign Application Priority Data

Oct. 20, 2017    (FR) ...................... 17 59881

(51) Int. Cl.
*H01M 4/96*    (2006.01)
*H01M 4/86*    (2006.01)
(Continued)

(52) U.S. Cl.
CPC ............... *H01M 4/96* (2013.01); *B82Y 30/00* (2013.01); *B82Y 40/00* (2013.01); *C01B 32/162* (2017.08);
(Continued)

(58) Field of Classification Search
None
See application file for complete search history.

(56) References Cited

U.S. PATENT DOCUMENTS 8,333,948 B2 * 12/2012 Pak ...................... H01M 4/926
423/447.3
10,170,769 B2 * 1/2019 Thomas .............. H01M 8/0245
(Continued)

FOREIGN PATENT DOCUMENTS

CN    103259023    8/2013
JP    2005-302305 A    10/2005
(Continued)

OTHER PUBLICATIONS

Japanese Office Action dated Oct. 15, 2019 in Japanese Patent Application No. 2018-196457 (with unedited computer generated English translation), 10 pages.
(Continued)

*Primary Examiner* — Maria Laios
(74) *Attorney, Agent, or Firm* — Oblon, McClelland, Maier & Neustadt, L.L.P.

(57) ABSTRACT

A multilayer structure, of use as composite diffusion layer in a proton-exchange membrane fuel cell, including at least one mat of carbon nanotubes having a unit diameter of less than or equal to 20 nm, defining at least one face of the structure, the mat of carbon nanotubes being superposed on a support based on carbon fibres. It also relates to a process for preparing such a multilayer structure and to the use thereof for an electrode of a PEMFC.

33 Claims, 4 Drawing Sheets

(51) Int. Cl.
- *H01M 4/88* (2006.01)
- *B82Y 30/00* (2011.01)
- *H01M 8/0234* (2016.01)
- *H01M 8/0247* (2016.01)
- *H01M 8/0245* (2016.01)
- *H01M 8/1018* (2016.01)
- *C23C 16/448* (2006.01)
- *B82Y 40/00* (2011.01)
- *C23C 16/26* (2006.01)
- *C23C 14/18* (2006.01)
- *C01B 32/162* (2017.01)
- *H01M 8/10* (2016.01)

(52) U.S. Cl.
CPC .............. *C23C 14/18* (2013.01); *C23C 16/26* (2013.01); *C23C 16/4488* (2013.01); *H01M 4/8626* (2013.01); *H01M 4/8657* (2013.01); *H01M 4/8807* (2013.01); *H01M 4/8821* (2013.01); *H01M 4/8867* (2013.01); *H01M 4/8875* (2013.01); *H01M 8/0234* (2013.01); *H01M 8/0245* (2013.01); *H01M 8/0247* (2013.01); *H01M 2008/1095* (2013.01); *H01M 2250/20* (2013.01)

(56) References Cited

U.S. PATENT DOCUMENTS

| | | | |
|---|---|---|---|
| 2003/0157397 A1* | 8/2003 | Barton | H01M 8/0245 429/481 |
| 2008/0247938 A1* | 10/2008 | Tsai | B01J 23/74 423/447.2 |
| 2009/0075157 A1 | 3/2009 | Pak et al. | |
| 2013/0216811 A1 | 8/2013 | Ghasemi-Nehjad et al. | |
| 2016/0115031 A1 | 4/2016 | Okuno et al. | |
| 2017/0244108 A1* | 8/2017 | Sode | H01M 4/8807 |
| 2018/0108919 A1* | 4/2018 | Lu | H01M 8/1004 |
| 2018/0219230 A1* | 8/2018 | Dale | H01M 4/926 |

FOREIGN PATENT DOCUMENTS

| | | |
|---|---|---|
| JP | 2010-153145 A | 7/2010 |
| WO | WO 2006/080702 A1 | 8/2006 |
| WO | WO 2014/191915 A1 | 12/2014 |

OTHER PUBLICATIONS

French Preliminary Search Report dated Jun. 19, 2018 in French Application 17 59881 filed on Oct. 20, 2017 (with English Translation of Categories of Cited Documents).

Kyu Taek Cho, et al., "Investigation of the role of the micro-porous layer in polymer electrolyte fuel cells with hydrogen deuterium contrast neutron radiography," Phys. Chem. Chem. Phys. 14, 2012, pp. 4296-4302.

Hasan K. Atiyeh, et al., "Experimental investigation of the role of a microporous layer on the water transport and performance of a PEM fuel cell," Journal of Power Sources 170, 2007, pp. 111-121.

Zhe Tang, et al., "In situ grown carbon nanotubes on carbon paper as integrated gas diffusion and catalyst layer for proton exchange membrane fuel cells," Electrochimica Acta 56, 2011, pp. 4327-4334.

Zhiyong Xie, et al., "Carbon nanotubes grown in situ on carbon paper as a microporous layer for proton exchange membrane fuel cells," International Journal of Hydrogen Energy 40, 2015, pp. 8958-8965.

Chao-Yang Liu, et al., "A review of the performance and analysis of proton exchange fuel cell membrane electrode assemblies," Journal of Power Sources 220, 2012, pp. 348-353.

* cited by examiner

MULTILAYER STRUCTURE INCORPORATING A MAT OF CARBON NANOTUBES AS DIFFUSION LAYER IN A PEMFC

The present invention relates to the field of proton-exchange membrane fuel cells. It relates more specifically to the use of a novel multilayer structure as diffusion layer in a proton-exchange membrane fuel cell, that makes it possible to result in significantly improved performances.

The proton-exchange membrane fuel cell (PEMFC) is an electrochemical energy conversion device which is considered to be a promising source of energy for transport applications. Although this technology has been at the forefront of marketing drives over the last two decades, especially by motor vehicle manufacturers, breakthroughs are still needed in order to satisfy all the cost and durability specifications.

The operating principle of a PEMFC fuel cell is based on the conversion of chemical energy into electrical energy by catalytic reaction of hydrogen and oxygen. A fuel cell comprises at least one individual cell, but more generally a stack in series of several individual cells, in order to meet the needs of the applications. Each individual cell comprises a membrane-electrode assembly, commonly referred to as the fuel cell core which constitutes the base element of PEMFCs.

Figure 1:
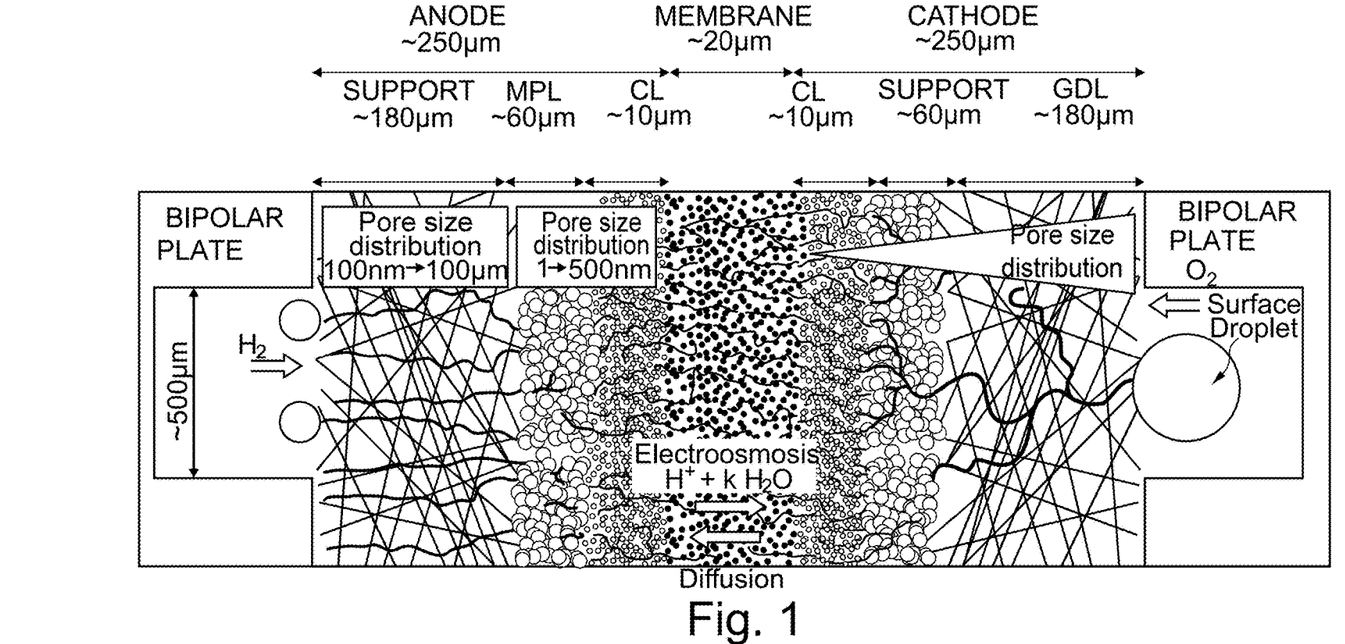
FIG. 1 illustrates, schematically, the structure of a PEMFC, with conventional dimensions of each of the parts of the PEMFC.

In the fuel cell core, as represented schematically in FIG. 1, the set of phenomena that give rise to the energy conversion take place. As in any electrochemical system, it is formed of two electrodes, an anode and a cathode, separated by an electrolyte. In the case of the PEMFC, the latter is a polymer membrane having a thickness of between 10 and 20 µm. The electrodes are formed of two main parts: an active layer (or CL for catalyst layer), site of the electrochemical reactions catalysed by platinum (having a thickness of 5 to 15 µm), and a diffusion layer (GDL for gas diffusion layer), having a thickness of between 150 and 300 µm.

This diffusion layer has a significant impact both on the performances and on the durability of the PEMFC, due to its role in all of the transport phenomena that take place within the fuel cell core. Thus, the diffusion layer is used for current collection, for supplying reactive gas, but also for eliminating water and heat produced within the fuel cell core. In order to meet all of these requirements, it must therefore have conflicting characteristics, by simultaneously combining good transport properties, on the one hand, of the electrons and of the heat and, on the other hand, of the liquid water and of the gases. The diffusion layers generally have two layers that make it possible to achieve optimal results: a microporous layer (MPL), typically having a thickness of between 20 and 80 µm, deposited on a substrate based on carbon fibres. Various studies ([1], [2]) have highlighted the role of this microporous layer for modifying the distribution of water between the anode and the cathode. The microporous layer appears both to prevent the drying out of the proton-conducting polymer under dry conditions and the flooding of the active layers under very wet conditions. Even though progress is being made, the understanding of the structure/properties and properties/performances relationships of the diffusion layer is still incomplete and remains very qualitative.

Thus, the improvement in the performances of PEMFCs in particular goes through the possibility of producing alternatives to the diffusion layers that are currently available.

The present invention specifically aims to provide novel diffusion layer structures that meet the aforementioned requirements and that make it possible to improve the performances of PEMFCs in which at least one of the electrodes incorporates such a diffusion layer.

More specifically, the inventors have observed that the use of an oriented and dense structure of carbon nanotubes having a mean unit diameter of less than 20 nm at the interface with the active layer of an electrode in a PEMFC makes it possible to significantly increase the performances of the fuel cell, compared to those obtained with conventional diffusion layer structures.

The present invention thus relates, according to a first of its aspects, to a multilayer structure, of use as composite diffusion layer in a proton-exchange membrane fuel cell, comprising at least one mat of carbon nanotubes having a mean unit diameter of less than or equal to 20 nm, defining at least one face of said multilayer structure, said mat of carbon nanotubes being superposed on a support based on carbon fibres.

A "mat of nanotubes" is understood to denote, within the meaning of the invention, a layer of carbon nanotubes which are substantially parallel to one another and which are oriented perpendicularly to the support based on carbon fibres, and the thickness of which is close to the unit length of the nanotubes.

A mat according to the invention of carbon nanotubes, denoted by CNTs in the remainder of the text, more particularly has a high density of carbon nanotubes, in particular a density greater than or equal to $10^{11}$ nanotubes per $cm^2$ and more particularly between $10^{11}$ and $10^{13}$ nanotubes per $cm^2$.

The publications by Tang et al. [3] and Xie et al. [4] already describe the growth of carbon nanotubes on carbon fibres. More particularly, Tang et al. describe the growth of a layer of carbon nanotubes by chemical vapour deposition (CVD) at the surface of a carbon paper, by using a thin layer of iron as growth catalyst of the CNTs. It is proposed to take advantage of the high porosity of the layer of carbon nanotubes formed in order to provide a high specific surface area to the platinum-based catalyst in an electrode of a PEMFC, and use such a layer both as diffusion layer (GDL) and as active layer (CL). As for Xie et al., they propose growing carbon nanotubes, by plasma-enhanced chemical vapour deposition (PECVD) and using a nickel-based catalyst, on the carbon fibres of a diffusion layer.

In these two studies, the carbon nanotubes are however in no way organized in the form of a dense mat of oriented nanotubes and, moreover, have a mean unit diameter of greater than 50 nm. Moreover, the performances obtained with the aid of the layers of nanotubes described in these publications remain inferior to those obtained with conventional diffusion layer structures formed from a microporous layer based on carbon black, graphene or graphite.

The expression "CNT mat superposed on the support" is understood to mean that the CNT layer is present on all or part of the surface of the support based on carbon fibres, and does not necessarily involve direct contact between said CNT layer and the underlying support. In other words, for a vertical stacking direction of the multilayer structure according to the invention, the contour of the CNT mat falls entirely within the vertical elevation of the contour of the underlying carbon-based support.

As described in detail in the remainder of the text, the support based on carbon fibres is used more particularly as a base for the growth of the CNTs, starting from the deposition of a catalytic stack of thin layers on the surface of the base support.

More generally, in the remainder of the text and unless otherwise indicated, the terms "superimposed", "borne" or "supported" are used equally to characterize the position of a layer (substrate or support) relative to another layer (substrate or support) and do not require the first layer (substrate or support) and the second layer (substrate or support) to be contiguous, i.e. in direct contact, with one another.

A CNT mat according to the invention may in particular be obtained by a catalytic route via a CNT growth method referred to as "base-growth" mode (as opposed to "tip-growth" mode), as described in the publication [5] in chapter 8 "Carbon Nanotube Synthesis and Growth Mechanism", subchapter 3 "CNT growth mechanism", using on the surface of the support, prior to the growth of the CNTs, a stack of specific thin layers, comprising at least one CNT growth catalyst.

This stack more particularly comprises the series of thin layers in the following order, from the face of the carbon-based support intended for supporting the CNT mat, up to the CNT mat:
  a/ optionally a metal layer made of metal M or a layer made of metal alloy based on the metal M or a layer made of graphene;
  b/ a titanium (Ti) layer;
  c/ an aluminium (Al) layer;
  d/ a layer of material(s) that catalyse(s) the growth of carbon nanotubes.

The interface between the support based on carbon fibres and the CNT mat which is superposed thereon according to the invention thus comprises, in particular is formed of, such a stack of thin layers.

This catalytic method of growing CNTs using such a multilayer stack has already been proposed in document WO 2014/191915 for forming dense CNT mats on metal substrates or substrates coated with graphene, with a view to increasing the electrical conductivity, advantageously thermal conductivity, between these CNT mats and said conductive faces of the substrates.

On the other hand, to the knowledge of the inventors, it has never been proposed to use this method of growing CNTs in order to form a CNT mat on carbon fibres, and even less to take advantage of the CNT mat thus formed in a composite diffusion layer of a proton-exchange membrane fuel cell.

Thus, according to another of its aspects, the invention relates to a process for preparing a multilayer structure, of use as composite diffusion layer in a proton-exchange membrane fuel cell (PEMFC), comprising at least the following steps:
  (i) producing, on at least one of the faces of a support based on carbon fibres, comprising less than 30% by weight of hydrophobic agent(s), in particular less than 10% by weight and preferably being free of hydrophobic agent, a catalytic stack of thin layers as described above; and
  (ii) growing a mat of carbon nanotubes on the stack according to a chemical vapour deposition technique, which is optionally plasma enhanced, and optionally hot-filament activated.

As illustrated in the examples that follow, the use of such a multilayer structure according to the invention as composite diffusion layer in an electrode of a PEMFC, with said CNT mat positioned in contact with the active layer (also referred to as catalyst layer) of the electrode, in other words in place of the microporous layer (typically based on carbon black, graphene or graphite), makes it possible to significantly improve the performances of the fuel cell. It typically makes it possible to result in efficiencies of 20% to 50% greater than those obtained with a conventional structure incorporating a microporous layer.

Thus, the invention also relates, according to another of its aspects, to the use of a multilayer structure as defined above, as composite diffusion layer in an electrode, in particular of the cathode, of a PEMFC, at least one CNT mat being positioned in contact with the active layer of the electrode.

As described in detail in the remainder of the text, several variants of the multilayer structure according to the invention can be envisaged, especially with regard to the nature of the PEMFC in which the multilayer structure is intended to be used.

Thus, within the context of the use of a multilayer structure according to the invention for forming a diffusion layer in a proton-exchange membrane fuel cell, operating at high temperature (also referred to as PEMFC-HT), typically at temperatures ranging from 130° C. to 200° C., it is not necessary for the diffusion layer to have a hydrophobic treatment. Fuel cells of PEMFC-HT type differ from PEMFC-LTs, that operate at low temperature, in particular by the nature of their electrolyte, which is formed of a polymer membrane impregnated by phosphoric acid. Due to their operating conditions (pressure, relative humidity of the gases at the inlet of the fuel cell), and in particular their operating temperature, there is no presence of liquid water within the components of the core of a PEMFC-HT fuel cell in nominal operation. Liquid water may optionally be present during shutdown or start-up phases, but its presence may be avoided by protocols known to a person skilled in the art. Hence, there is no liquid water in this type of fuel cell during the use thereof, which makes a hydrophobic treatment pointless.

On the other hand, within the context of manufacturing a proton-exchange membrane fuel cell, which operates at low temperature (also referred to as PEMFC-LT), typically at temperatures below or equal to 120° C., the diffusion layers must imperatively have a hydrophobic treatment, the latter being essential for obtaining a component suitable for the wide range of operating conditions of PEMFCs, in particular suitable for very wet conditions.

However, the process for growing carbon nanotubes according to the invention, involving high temperatures, typically around 500° C., is incompatible with most hydrophobic agents generally used such as perfluoropolymers, the latter degrading at high temperatures. Moreover, the conventional techniques of impregnation by a hydrophobic polymer cannot be envisaged due to the risk of destroying the organization and the nanostructure of the carbon nanotubes.

It is to the inventors' credit to have developed various variants for preparing a multilayer structure according to the invention capable of being used as diffusion layer for a PEMFC, in particular for a PEMFC-LT, and reconciling the presence of a CNT mat in accordance with the invention with a hydrophobic treatment.

More particularly, according to one embodiment variant, the support based on carbon fibres of a multilayer structure according to the invention may comprise:
  a substrate based on carbon fibres, optionally hydrophobic, in particular impregnated by at least one hydrophobic agent; and at least one layer based on carbon fibres borne by one of the faces of said substrate, comprising less than 30% by weight of hydrophobic agent(s), in particular less than 10% by weight and preferably free of hydrophobic agent, said layer having, on at least its face opposite said substrate, said CNT mat.

According to another embodiment variant, the support based on carbon fibres of a multilayer structure according to the invention may be formed of a solid substrate based on carbon fibres, having on one of its faces said mat of carbon nanotubes and having, on its face opposite the one supporting the CNT mat, hydrophobic properties, in particular being impregnated by at least one hydrophobic agent, and/or whose face opposite the CNT mat is hydrophobic or coated by a hydrophobic film.

Other particularly advantageous embodiments of multilayer structures according to the invention, in particular incorporating at least two CNT mats according to the invention, are disclosed in the remainder of the text.

The invention may be understood better from reading the detailed description that follows, given with reference to the appended drawings in which.

It should be noted that, for reasons of clarity, the various elements in FIGS. 1 to 6 are not drawn to scale, the actual dimensions of the various parts not being respected.

Furthermore, for reasons of clarity, the catalytic interface stack between a support based on carbon fibres and a CNT mat does not appear in FIGS. 2 to 6.

In the remainder of the text, the expressions "between . . . and . . . ", "ranging from . . . to . . . " and "varying from . . . to . . . " are equivalent and are understood to mean that the limits are included, unless otherwise mentioned.

Unless otherwise indicated, the expression "containing a" should be understood as "comprising at least one".

Mat of Carbon Nanotubes

According to one of the essential features, a multilayer structure according to the invention has at least one mat of carbon nanotubes having a unit diameter of less than or equal to 20 nm, defining at least one face of said structure.

As described in detail in the remainder of the text, the CNT mat is intended to be positioned at the interface with the active layer in the electrode of the PEMFC.

In particular, the surface of the carbon nanotubes of a mat according to the invention is not functionalized by catalyst nanoparticles, for example by platinum nanoparticles.

Hence, a multilayer structure according to the invention is intended to be combined with a conventional active layer in order to form an electrode of a membrane-electrode assembly in a PEMFC fuel cell, as detailed in the rest of the text.

Preferably, the unit diameter of the CNTs of the mat according to the invention is strictly less than 20 nm, in particular between 2 and 20 nm, and more particularly between 3 and 10 nm.

It may be estimated by transmission electron microscopy.

The length of the carbon nanotubes of a CNT mat according to the invention may be between 1 and 200 µm, in particular between 5 and 100 µm, especially between 5 and 50 µm and more particularly between 10 and 20 µm.

Advantageously, a CNT mat of a multilayer structure according to the invention has a CNT density of greater than or equal to $10^{11}$ CNT per cm², preferably between $10^{11}$ and $10^{13}$ CNT per cm².

A CNT mat of a multilayer structure according to the invention has a thickness similar to the unit length of the CNTs, in other words a thickness of between 1 µm and 200 µm, in particular between 1 and 100 µm, especially between 5 and 50 µm and more particularly between 10 and 20 µm, the thickness being defined along the stacking direction, in other words along the axis (X) perpendicular to the interface between the support based on carbon fibres and the CNT mat which is superimposed thereon.

The dense mat of small CNTs according to the invention may more particularly be obtained in the form of multi-walled nanotubes, also referred to as MWNTs (multi-walled carbon nanotubes).

As mentioned above, a dense mat of small CNTs according to the invention may be formed via the production, on at least one face of a support based on carbon fibres, of a stack, subsequently referred to as a "catalytic stack", having at least three conductive layers. Such a stack furthermore provides good electrical and thermal conduction between the CNTs and the face of said support based on carbon fibres.

Thus, the interface between the support based on carbon fibres and the mat of carbon nanotubes which is superposed thereon may comprise, preferably is formed of, a stack of thin layers comprising, in this order, from the support up to the CNT mat:

a/ optionally, metal layer made of metal M or layer made of metal alloy based on the metal M or layer made of graphene, in particular a metal layer made of metal, and preferably made of iron (Fe);

b/ titanium (Ti) layer;

c/ aluminium (Al) layer;

d/ layer of material(s) that catalyse(s) the growth of carbon nanotubes, in particular made of iron (Fe).

In other words, a multilayer structure according to the invention may more particularly comprise at least one series of superimposed layers that are contiguous with one another, in the following stacking order:

layer based on carbon fibres;

optionally, metal layer made of metal M or layer made of metal alloy based on the metal M or layer made of graphene, in particular a layer made of iron;

titanium (Ti) layer;

aluminium (Al) layer;

layer of material(s) that catalyse(s) the growth of carbon nanotubes, in particular made of iron; and CNT mat.

When it is present, the metal M layer is capable of preventing the diffusion of the Ti into the underlying structure of carbon fibres. It may thus act as a thin layer of a metal that does not diffuse very much into the layer of carbon fibres, and into the Ti.

Preferably, the metal M of the metal layer deposited directly on the face of the support based on carbon fibres intended to support the CNT mat is chosen from iron (Fe), chromium (Cr), nickel (Ni), cobalt (Co) or palladium (Pd), and also from all the binary, ternary or quaternary alloys between these metals.

According to one particular embodiment, the metal M is iron.

According to yet another particular embodiment, the metal M is of the same nature as the layer d/ of material that catalyses the growth of carbon nanotubes. This layer then makes it possible to control, via its thickness, the density of carbon nanotubes in the mat of nanotubes.

The thickness of this layer a/ deposited directly on the support based on carbon fibres may in particular be between 0.5 and 20 nm.

The thin Al/Ti bilayer has several functions. It enables the dewetting of the catalyst and the growth of CNTs according to the "base-growth" mode, thus ensuring the growth of dense mats of CNTs having small unit diameters, typically of less than 10 nm. It also has the role of a barrier, both barrier to the diffusion of the catalyst and in particular barrier to oxidation. It thus makes it possible to control and reduce the thickness of the oxidized layer that is possibly formed during the growth of the CNTs. In the end, it thus makes it possible to obtain an excellent electrical conductivity of the interface.

The Ti layer may have a thickness ranging from 2 to 10 nm.

The Al layer may have a thickness ranging from 2 to 10 nm.

The stack of thin layers comprising at least Ti/Al/Fe enables the growth of small CNTs on the support based on carbon fibres, while ensuring good electrical and thermal conduction between the CNTs and the support.

According to one particular embodiment, the material(s) that catalyse(s) the growth of the carbon nanotubes, of the layer of the top of the interface stack, is (are) chosen from iron (Fe), chromium (Cr), nickel (Ni), cobalt (Co) or palladium (Pd), and also from all the binary, ternary or quaternary alloys between these metals.

According to one advantageous variant, the layer deposited directly on the face of the support based on carbon fibres intended to support the CNT mat, and the layer of material that catalyses the growth of CNTs are formed of the same material. This advantageously makes it possible to simplify the process of depositing the thin layers, in particular by vacuum evaporation in the same vacuum cycle. This also makes it possible to control the density of carbon nanotubes in the nanotube mat.

The thickness of the layer of material(s) that catalyse(s) the growth of carbon nanotubes may more particularly be between 0.2 and 5 nm, preferably between 0.25 and 2 nm.

According to one particular embodiment, the interface stack according to the invention, from the support based on carbon fibres up to the CNT mat, may be the following: Fe/Ti/Al/Fe or Ti/Al/Fe, the layer of iron directly in contact with the underlying layer based on carbon fibres having if need be a thickness of between 0.5 and 10 nm.

Support Based on Carbon Fibres

The mat of carbon nanotubes according to the invention is formed at the surface of a support based on carbon fibres.

It is understood that the support based on carbon fibres must be compatible with the various steps of the process for manufacturing the mat of carbon nanotubes, namely with the steps of deposition of the catalytic stack of thin layers for the growth of the CNTs, and the actual growth of the carbon nanotubes.

In particular, the chemical and physical structure of the support based on carbon fibres, along with its mechanical properties, must not be degraded in such a way that, on the one hand it retains its functions and, on the other hand, that it does not emit products which might contaminate the catalyst of the CNTs growth or the equipment necessary for the manufacturing process of the multilayer structure according to the invention.

Hence, as described hereafter, the support based on carbon fibres may reach temperatures of 350° C. to 700° C. during the growth of the CNTs.

The supports based on carbon fibres, commercially available and used as such, without any pre-treatment, could contaminate the device for growing carbon nanotubes, subsequently preventing it from fulfilling its function, and also the growth catalyst, resulting, as a consequence, in a drop in the efficiency of the process for preparing the CNT mat, and in particular influencing the size of the obtained carbon nanotubes.

Advantageously, the inventors have discovered that a specific thermal treatment, operated in a gas atmosphere and at a specific temperature, of the support based on carbon fibres, prior to its use as support for the growth of a CNT mat according to the invention, allows avoiding the risk of contamination as mentioned here-above.

Thus, according to a particular embodiment, the support based on carbon fibres can be submitted, prior to the formation of the catalytic stack, to a heat treatment at a temperature of between 500° C. and 700° C., under an atmosphere of inert gas(es), air, hydrogen, oxygen, or a mixture of these gases, in particular a mixture of inert gas(es) with hydrogen.

The duration of the thermal treatment may range from 1 hour to 5 hours, in particular be of about 2 hours.

As an example, the carbon fibre support, such as carbon fibre paper commercialized under the reference SpectraCarb 2050A0850, SpectraCarb 2050A0550 or Toray TGP-H-030, may be heat-treated in air at 616° C. for 2 hours.

According to another example, the carbon fibre support may be heat-treated in a mixture of inert gas in particular nitrogen, with hydrogen, such as a mixture 95 mol % $N_2$/5 mol % $H_2$ mixture at 616° C. for 2 hours.

Formation of the Mat of Nanotubes

A CNT mat according to the invention may be formed on at least one of the faces of a support based on carbon fibres, preferably having preliminarily undergone a heat treatment as described above, via a "base-growth" CNT growth method, involving at least the following steps:

(i) producing, on at least one of the faces of a support based on carbon fibres, comprising less than 30% by weight of hydrophobic agent(s), in particular less than 10% by weight of hydrophobic agent(s), or even free of hydrophobic agent, a stack of thin layers, as described above; and (ii) growing a mat of carbon nanotubes on the stack according to a chemical vapour deposition (CVD) technique, which is optionally plasma enhanced, and optionally hot-filament activated (HFCVD or hot-wire CVD).

According to one particular embodiment, before carrying out the growth step, the layer of catalyst material(s) is oxidized by means of an air plasma.

The stack of thin layers may more particularly be formed in step (i) by successive depositions of thin layers according to a vacuum evaporation technique in one and the same vacuum cycle. Of course, a person skilled in the art is able to use any other technique that allows a good control of the thicknesses of layers obtained.

The growth of the CNTs in step (ii) is preferably carried out by HFCVD.

It is up to a person skilled in the art to adjust the implementation conditions of the deposition by CVD, in particular HFCVD, in order to obtain the desired CNT mat.

It may be carried out using acetylene as precursor of carbon.

The support based on carbon fibres may be brought to a temperature ranging from 350° C. to 700° C., in particular from 400° C. to 500° C.

According to one particular embodiment, the chemical vapour deposition is carried out at a pressure ranging from 0.1 mbar to 1000 mbar, in particular from 0.1 to 10 mbar.

The growth duration may be between 1 minute and 2 hours, in particular between 5 minutes and 30 minutes.

As described in detail in the embodiment variants that will follow, a multilayer structure according to the invention may advantageously comprise at least two CNT mats, preferably at least two CNT mats defining two opposite faces of said structure.

It is up to a person skilled in the art to adjust the operating conditions so as to grow the carbon nanotubes consecutively or simultaneously on either side of a support based on carbon fibres. This involves in particular carrying out the deposition of the catalytic stack of layers on the two faces of the support based on carbon fibres.

Multilayer Structures According to the Invention

As mentioned above, a multilayer structure comprises a support based on carbon fibres, supporting at least one CNT mat.

Advantageously, the support has a hydrophobic treatment, so as to enable the use of the multilayer structure according to the invention as diffusion layer in PEMFCs operating at low temperature.

Thus, a multilayer structure according to the invention may comprise a support based on carbon fibres impregnated over all or part of its volume by at least one hydrophobic agent, and/or whose face, opposite to the one supporting said CNT mat, is hydrophobic or coated with a hydrophobic film.

According to one embodiment variant, the support based on carbon fibres is impregnated on all or a part of its volume by at least one hydrophobic agent and/or has, on its face opposite the one supporting the CNT mat, a film incorporating at least one hydrophobic agent.

Said hydrophobic agent(s) may in particular be selected from fluoropolymers and perfluoropolymers. These may for example be polymers selected from poly(vinylidene fluoride) (PVDF), poly(tetrafluoroethylene) (PTFE), fluorinated ethylene propylene (FEP), poly(vinylidene fluoride-co-hexafluoropropylene) (PVDF-HFP), poly(ethylene-co-tetrafluoroethylene) (ETFE) or perfluoroalkoxy (PFA).

The impregnation/deposition treatment may be more particularly implemented from a suspension or solution of said hydrophobic agent(s), in particular of said fluorinated or perfluorinated hydrophobic polymer, such as PTFE. It more particularly comprises the spraying of said suspension or solution at the surface of the face to be treated, or by total or partial immersion of the substrate in the suspension or solution of said hydrophobic agent(s), followed by a drying step in order to evaporate the solvents.

According to another embodiment variant, the face of the support based on carbon fibres, opposite the one supporting the CNT mat, is treated by plasma in order to give it hydrophobic properties. The plasma treatment more particularly comprises the exposition of the face to be treated to a reactive plasma comprising one or several fluorinated gas(es).

This plasma treatment may be carried out on one or the other of the faces of the carbon fibre support, before or after the growth of the mat of carbon nanotubes. Preferably, the plasma treatment is carried out after the growth of the mat of carbon nanotubes and on the face opposite to the one supporting the CNT mat, as detailed in the rest of the text.

The plasma treatment may be carried out in various types of plasma reactor, including in particular radiofrequency inductively coupled plasma reactors, radiofrequency capacitively coupled plasma reactors and microwave excited plasma reactors.

The fluorinated gas(es) can be selected from sulfur hexafluoride ($SF_6$), tetrafluoromethane ($CF_4$), trifluoromethane ($CHF_3$), difluoromethane ($CH2F_2$), perfluorocyclobutane ($C_4F_8$) and mixtures thereof. The fluorinated gas(es) are more particularly diluted with other gases such as for example argon, ammonia or molecular hydrogen.

It is up to a person skilled in the art to adjust the implementation conditions of the plasma treatment, in order to obtain the desired hydrophobic surface.

As an example, the plasma treatment may be carried out in a radiofrequency capacitively coupled plasma reactor under the following conditions: 100 sccm of $SF_6$ at 100 mTorr, with an RF power (13.56 MHz) of 100 W for 2 minutes.

As another example, the plasma treatment may be carried out in a radiofrequency inductively coupled plasma reactor under the following conditions: 100 sccm of $CF_4$ at 20 mTorr, with an RF power (13.56 MHz) of 500 W for 5 minutes.

1$^{st}$ Variant: Carbon-Based Substrate Supporting a Layer Based on Carbon Fibres According to a first embodiment variant, the support based on carbon fibres of a multilayer structure according to the invention may comprise:

a substrate (3) based on carbon fibres, preferably hydrophobic, in particular impregnated by at least one hydrophobic agent; and a layer (2) based on carbon fibres, borne by at least one of the faces of said substrate, comprising less than 30% by weight of hydrophobic agent(s), in particular less than 10% by weight of hydrophobic agent(s) and more particularly free of hydrophobic agent, said layer having, on at least its face opposite said substrate, said CNT mat (1).

Such structuring of the multilayer structure in two parts, hydrophobic treated substrate/non-hydrophobic layer based on carbon fibres, makes it possible to prevent, during the preparation of the multilayer structure according to the invention, any interaction between the hydrophobic agent and the CNT mat liable to have an impact on the organization and the nanostructure of the CNTs.

Figure 2:
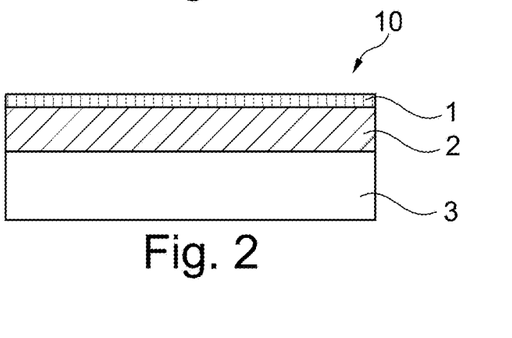
FIGS. 2 to 6 represent, schematically, in a vertical cross-sectional plane, various variants of multilayer structure (10) according to the invention, comprising at least one mat of carbon nanotubes (1) in accordance with the invention.

Such a structure is represented schematically in FIG. 2. As indicated above, it is understood that the catalytic interface stack as described above, that may be present between the layer (2) based on carbon fibres and the CNT mat (1), is not represented in the appended figures.

The substrate (3) based on carbon fibres will be more simply denoted in the remainder of the text under the designation "carbon-based substrate".

It may be of the type of substrates conventionally used for supporting the microporous layer (MPL) in a conventional PEMFC electrode.

The carbon-based substrate may take the form of a felt, paper or fabric. It is generally a nonwoven fabric of carbon fibres.

The carbon-based substrate advantageously has a porosity of between 60% and 85%, in particular between 70% and 80%. The porosity corresponds to the percentage of void volume in the carbon substrate relative to its total volume.

The carbon-based substrate may have a thickness of between 50 and 400 micrometres, in particular between 100 and 200 micrometres.

By way of example of a carbon-based substrate, mention may be made of the carbon fibre paper sold under the reference Toray TGP-H-030.

As indicated above, the substrate based on carbon fibres is advantageously hydrophobic. It is preferably impregnated by at least one hydrophobic agent, in particular as defined above. This may for example be polytetrafluoroethylene (or PTFE).

The carbon fibre substrate having undergone a hydrophobic treatment, in particular impregnated by at least one hydrophobic agent will be denoted more simply in the remainder of the text under the designation "hydrophobic carbon-based substrate".

Advantageously, the carbon substrate may comprise between 2% and 40% by weight, in particular between 5% and 15% by weight of hydrophobic agent(s), relative to its total weight.

By way of example, mention may be made of the carbon fibre paper sold under the reference Toray TGP-H-030, treated with 5% to 20% by weight of hydrophobic agent(s), preferably made of PTFE.

Regarding the layer (2) based on carbon fibres, the carbon fibres of said layer may or may not be identical to those of the carbon-based substrate.

The layer (2) comprises less than 30% by weight of hydrophobic agent(s), in particular less than 20% by weight of hydrophobic agent(s) and more particularly less than 10% by weight of hydrophobic agent(s).

Preferably, the layer (2) is to be completely devoid of hydrophobic agent.

The layer based on carbon fibres advantageously has a porosity of between 60% and 85%, in particular between 70% and 80%.

It may have a thickness of between 40 and 200 micrometres, in particular between 40 and 100 micrometres.

In particular, the thickness of the assembly formed by the layer based on carbon fibres surmounted by the mat of carbon nanotubes (including the catalytic interface stack between the carbon-based layer and the mat) may be between 50 and 220 µm, in particular between 60 and 120 µm.

Preparation of the Multilayer Structure

The process for preparing a multilayer structure according to this first embodiment variant may comprise more particularly at least the following steps:

(a1) producing, according to the aforementioned steps (i) and (ii), a CNT mat on at least one of the faces of a support based on carbon fibres, comprising less than 30% by weight of hydrophobic agent(s), in particular less than 10% by weight of hydrophobic agent(s), preferably free of hydrophobic agent; and (a2) depositing a support prepared according to step (a1) on at least one of the faces of a carbon-based substrate, preferably having preliminarily undergone a hydrophobic treatment, in particular pre-impregnated by at least one hydrophobic agent, at least one CNT mat being present on the face of the support opposite said carbon-based substrate.

The support in step (a1), intended to form the layer based on carbon fibres of the multilayer structure, as described above, may in particular be a nonwoven fabric of carbon fibres.

As examples of supports based on carbon fibres, mention may be made of composite carbon fibre papers sold under the references Freudenberg H14 or H15 or Toray TGP-H-030.

As previously mentioned, the carbon fibre substrate may be, prior to the production of the CNT mat, thermally treated, in particular at a temperature of between 500° C. and 700° C., under atmosphere of inert gas(es), air, hydrogen, oxygen, or a mixture of these gases, in particular a mixture of inert gas(es) with hydrogen.

The deposition, in step (a2), of the support bearing on at least one of its faces a CNT mat according to the invention, on the surface of a carbon-based substrate that has already undergone a hydrophobic treatment, makes it possible to avoid any risk of damaging interaction between the CNT mat and the hydrophobic treatment.

The hydrophobic treatment of the substrate carried out, prior to step (a2), may thus be performed by different methods as described above.

Preferably, it is an impregnation treatment with at least one hydrophobic agent, in particular a hydrophobic polymer, as described here-above.

Such a treatment of impregnating with a hydrophobic polymer may be carried out for example using a suspension or solution of said hydrophobic polymer, such as for example PTFE, by:

immersing the substrate in the suspension or solution of said hydrophobic polymer;

drying the impregnated substrate/evaporation of the solvents;

optionally sintering the dried substrate.

The two first steps may be repeated so as to achieve the desired concentration of hydrophobic agent.

Other treatments for impregnating the carbon-based substrate may be carried out, such as for example the one described in application EP 3 206 247.

Variants of Multilayer Structures

According to one particular embodiment, step (a1) may comprise the production of CNT mats on either side of the support based on carbon fibres.

More specifically, a catalytic stack of thin layers may be produced, according to step (i) described above, on either side of the support based on carbon fibres, followed by the growth of the CNTs performed by CVD, in particular by HFCVD, consecutively or simultaneously on either side of the support.

Figure 3:
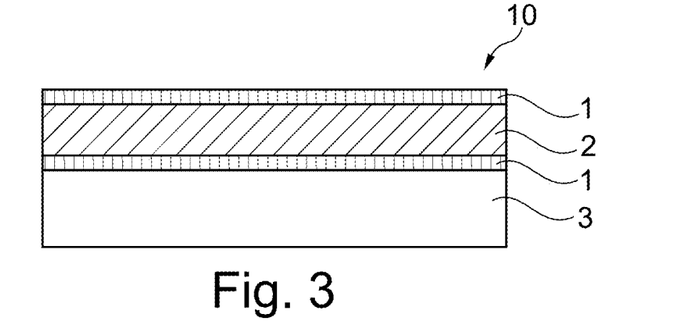

Within the context of this embodiment, at the end of the deposition, according to step (a2) described above, of said support on a carbon substrate, the multilayer structure (10) according to the invention thus comprises, besides a first surface mat (1), a second CNT mat (1) intercalated between the carbon-based substrate (3) and the layer based on carbon fibres (2).

Such a structure is represented schematically in FIG. 3.

The presence of a CNT mat at the interface between the layer based on carbon fibres (2) and the carbon-based substrate (3) has the advantage of enabling better contact between said layer and the carbon-based substrate. In fact, the contact area is increased for an interface between a CNT mat and the carbon fibres of the substrate (3), compared to an interface between the carbon fibres of the layer (2) and those of the substrate (3).

A multilayer structure, of use as composite diffusion layer in a PEMFC according to the invention, may thus comprise the following series of superimposed layers:

substrate (3) based on carbon fibres, preferably hydrophobic, in particular impregnated by at least one hydrophobic agent;

CNT mat (1);

layer (2) based on carbon fibres, incorporating less than 30% by weight of hydrophobic agent, in particular less than 10% by weight of hydrophobic agent, preferably free of hydrophobic agent; and CNT mat (1), the latter CNT mat defining a face of said multilayer structure and being intended to be in contact with the catalyst layer (or active layer) of the electrode of the PEMFC.

According to another particular embodiment, a multilayer structure according to the invention may comprise at least two CNT mats defining two opposite faces of said structure.

Thus, according to one embodiment variant, step (a2) may comprise the deposition of supports prepared according to step (a1) on either side of the hydrophobic carbon-based substrate, each of the CNT mats being at least present on the faces of the supports opposite said carbon-based substrate.

Figure 4:
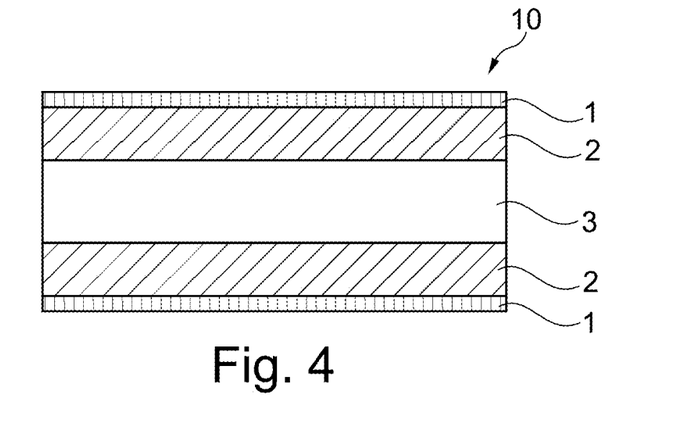

The multilayer structure thus formed comprises a hydrophobic carbon-based substrate (3), intercalated between two layers based on carbon fibres, incorporating less than 30% by weight of hydrophobic agent, in particular less than 10% by weight of hydrophobic agent, and preferably free of hydrophobic agent, each of the layers (2) having, on its face opposite the carbon-based substrate (3), a CNT mat (1) according to the invention.

This embodiment variant is represented schematically in FIG. 4.

Such a multilayer structure having, on its two opposite faces, two CNT mats is particularly advantageous during the use thereof as diffusion layer in a PEMFC. In fact, the presence of a CNT mat, at the interface of the diffusion layer with the bipolar current collector plate of the electrode, advantageously makes it possible to improve the electrical contact between the diffusion layer and the bipolar plate. In fact, instead of a contact between carbon fibres and the bipolar plate of cylinder/plane type, the contact area is increased between the diffusion layer and the bipolar plate due to the presence at the interface of a CNT mat. Thus, the resulting contact resistance between the diffusion layer and the bipolar plate is advantageously reduced.

It is understood that the aforementioned various variants and embodiments may be combined, insofar as possible, to produce other variants of a multilayer structure according to the invention of use as diffusion layer in a PEMFC.

Figure 5:
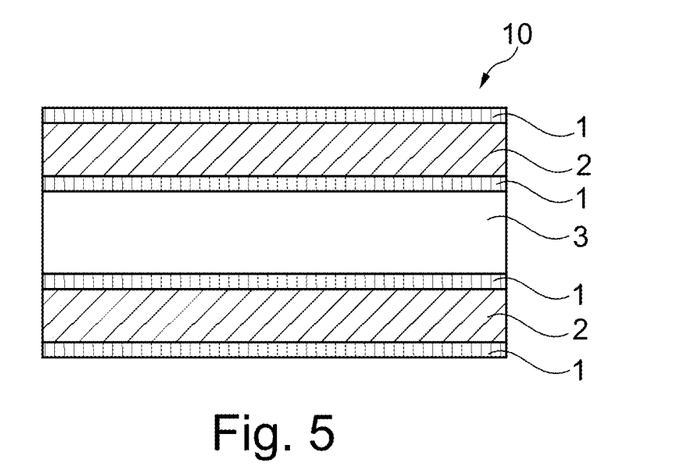

Thus, for example, a multilayer structure according to the invention may comprise a hydrophobic carbon-based substrate (3), intercalated between two layers (2) based on carbon fibres, incorporating less than 30% by weight of hydrophobic agent, in particular less than 10% by weight of hydrophobic agent, preferably free of hydrophobic agent, each of these layers having on each of their faces a CNT mat according to the invention.

This embodiment variant is represented schematically in FIG. 5.

A multilayer structure, of use as composite diffusion layer in a PEMFC according to the invention, may thus comprise the following series of superimposed layers:

CNT mat;

layer based on carbon fibres, incorporating less than 30% by weight of hydrophobic agent, preferably free of hydrophobic agent;

CNT mat;

carbon-based substrate which is advantageously hydrophobic;

CNT mat;

layer based on carbon fibres, incorporating less than 30% by weight of hydrophobic agent, preferably free of hydrophobic agent; and CNT mat, one of the CNT mats defining a face of said multilayer structure that is intended to be in contact with the catalyst layer (or active layer) of the electrode in the PEMFC in which the diffusion layer will be used.

$2^{nd}$ Variant: Carbon-Based Substrate Optionally Hydrophobic Treated

Figure 6:
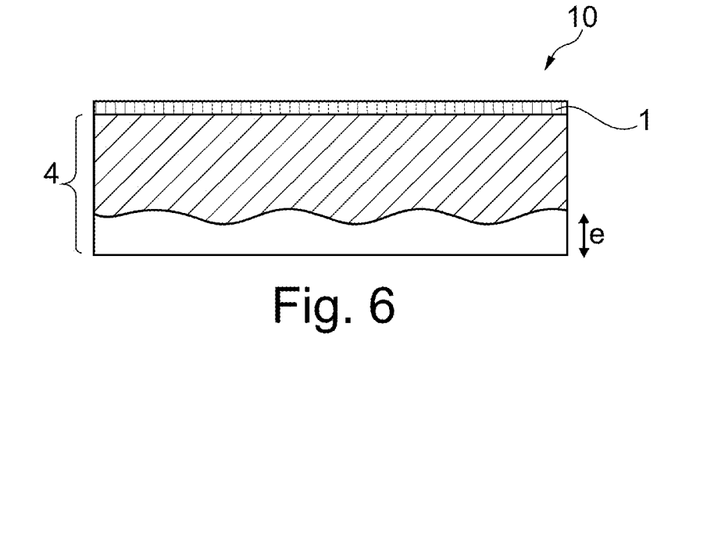

According to yet another embodiment variant, the support based on carbon fibres of a multilayer structure according to the invention may be formed of a solid substrate (4) based on carbon fibres, having on one of its faces said mat of carbon nanotubes and having optionally, on its face opposite the one supporting the CNT mat, hydrophobic properties, being in particular impregnated, on its face opposite the one supporting the CNT mat, by at least one hydrophobic agent, and/or whose face opposite the CNT mat is hydrophobic or coated with a hydrophobic film.

The expression "solid substrate" is understood to mean the fact that the support based on carbon fibres does not result, unlike the first variant described in detail above, from the stacking of one or more layers based on carbon fibres.

The solid substrate (4) based on carbon fibres, referred to subsequently as "carbon-based substrate", may be as described above. It may take the form of a felt, paper or fabric. It is generally a nonwoven fabric of carbon fibres.

The carbon-based substrate advantageously has a porosity of between 60% and 85%, in particular between 70% and 80%. The porosity corresponds to the percentage of void volume in the carbon substrate relative to its total volume.

The carbon-based substrate may have a thickness of between 80 and 400 micrometres, in particular between 100 and 200 micrometres.

By way of example of a carbon-based substrate, mention may be made of the carbon fibre paper sold under the reference Toray TGP-H-090.

In the case where a hydrophobic treatment of the multilayer structure is not required, typically for the use thereof in a PEMFC-HT, the carbon fibre substrate may advantageously have, on each of its opposite faces, a CNT mat.

As mentioned above, the presence of a CNT mat, at the interface of the diffusion layer with the current collector plate of the electrode of the PEMFC, advantageously makes it possible to reduce the contact resistance between the diffusion layer and the current collector plate.

According to another particular embodiment, the carbon-based substrate (4) may have on its face opposite the one supporting the CNT mat, hydrophobic properties, in particular be impregnated on its face opposite the one supporting the CNT mat, with at least one hydrophobic agent, and/or have, on said face opposite the CNT mat, a film comprising, or even being formed of, at least one hydrophobic agent.

The hydrophobic agent may more particularly be selected from the hydrophobic polymers as described above. It may for example be PTFE.

Preferably, the carbon-based substrate (4) is thus impregnated over a thickness, e, extending from its face opposite the one supporting the CNT mat, that is strictly less than the total thickness of the substrate. This thus makes it possible to avoid any contact with the CNT mat.

In particular, the impregnation thickness, denoted by e, may represent less than 95% of the total thickness of the substrate, in particular less than 90%, more particularly less than 80% and in particular less than 60% of the total thickness of the substrate. It is in particular between 20 and 180 µm, preferably between 40 and 100 µm.

The impregnation thickness may be estimated by EDX mapping in SEM on a cross section of the sample.

Such a variant of multilayer structure according to the invention is represented in FIG. 6.

Preferably, the portion of the substrate impregnated has a hydrophobic agent(s) loading level of between 2% and 40% by weight, in particular between 5% and 15% by weight.

Alternatively, the hydrophobic properties of the carbon-based substrate face opposite the one supporting the CNT mat, may be obtained by plasma treatment, as described here-above.

Preparation of the Multilayer Structure

The process for preparing a multilayer structure according to this embodiment variant may more particularly comprise at least the following steps:

(b1) producing, according to the aforementioned steps (i) and (ii), a CNT mat on at least one of the faces of a substrate based on carbon fibres, comprising less than 30% by weight of hydrophobic agent(s), in particular less than 10% by weight of hydrophobic agent(s), preferably free of hydrophobic agent;

and optionally, in the case of the formation of a CNT mat on a single face of said substrate, (b2) hydrophobic treating the substrate, on the face opposite the one supporting the CNT mat, in particular mpregnating the substrate, on the face opposite the one supporting the CNT mat, by at least one hydrophobic agent, forming, on the face opposite the one supporting the CNT mat, a film comprising, or even being formed of, at least one hydrophobic agent, and/or plasma treating with a fluorinated gas, said hydrophobic treatment being performed under conditions that are adjusted so as not to adversely affect the structure of the CNT mat formed in step (b1).

As described above, the support based on carbon fibres may be, prior to the production of the CNT mat, thermally treated, in particular at a temperature of between 500° C. and 700° C., under atmosphere of inert gas(es), air, hydrogen, oxygen, or a mixture of these gases, in particular a mixture of inert gas(es) with hydrogen.

As mentioned above, in the case where a hydrophobic treatment of the diffusion layer is pointless, step (b1) may comprise the production of CNT mats on either side of the substrate based on carbon fibres. More specifically, a catalytic stack of thin layers may then be produced, according to step (i) described above, on either side of the substrate based on carbon fibres, followed by the growth of the CNTs performed by CVD, in particular by HFCVD, consecutively or simultaneously on either side of the substrate.

Within the context of the implementation of a hydrophobic treatment (step (b2)), it is important that said hydrophobic treatment, for example by impregnation of the substrate by the hydrophobic agent does not disrupt the structure of the CNT mat previously formed in step (b1).

A person skilled in the art is capable of adjusting the implementation conditions in step (b2) of the hydrophobic treatment, for example for impregnating, depositing the hydrophobic agent on the surface of the substrate or even plasma treating, so that it does not adversely affect the structure of the CNT mat. In particular, the impregnation treatment is carried out so that the hydrophobic agent does not penetrate the structure of the CNT layer.

As described within the context of the first variant, the impregnation/deposition treatment may be carried out using a suspension or solution of said hydrophobic agent, in particular of the hydrophobic fluoropolymer or perfluoropolymer, such as for example PTFE, by spraying said suspension or solution on the surface of the face opposite the one supporting the CNT mat; or by partial immersion of the substrate in the suspension or solution of said hydrophobic agent.

The deposition/impregnation step may be followed by a drying step suitable for evaporating the solvent(s). It is also possible to carry out one or more heat treatment steps that aim to destroy the organic impurities, to stabilize the hydrophobic polymer film at the surface of the carbon substrate and/or to sinter the polymer. Sintering enables the polymer in the form of particles to flow in order to form a film.

It is up to a person skilled in the art to adjust the conditions, in particular the temperature and the duration, of the heat treatment with regard, on the one hand, to the hydrophobic agent used and, on the other hand, so as to prevent any degradation of said hydrophobic agent and of the CNT mat.

Preferably, the substrate, throughout the duration of the hydrophobic treatment, is maintained at a temperature below or equal to 500° C., preferably below or equal to 400° C. The duration of the heat treatment may be between 2 and 60 minutes, in particular between 5 and 30 minutes.

Alternatively, the face of the substrate opposite the one supporting the CNT mat, may be exposed to a plasma treatment with a plasma comprising at least one fluorinated gas, as described above, in order to give it hydrophobic properties.

Application of the Multilayer Structure

A multilayer structure according to the invention advantageously has a total thickness of between 100 and 600 µm, preferably between 100 and 300 µm and advantageously between 150 and 250 µm.

As mentioned previously, a multilayer structure advantageously serves as diffusion layer in an electrode of a PEMFC, at least one CNT mat of said multilayer structure being positioned in contact with the active layer (also referred to as catalyst layer) of the electrode.

The invention thus relates, according to yet another of its aspects, to an electrode, in particular cathode, for a PEMFC, comprising a multilayer structure according to the invention, at least one CNT mat of said structure being positioned in contact with the active layer of the electrode.

It also relates, according to another of its aspects, to a proton-exchange membrane fuel cell comprising at least one such electrode. Preferably, a PEMFC fuel cell comprises two electrodes, anode and cathode, in accordance with the invention.

Within the context of preparing an electrode for a PEMFC that operates at low temperature (PEMFC-LT), the multilayer structure is hydrophobically treated. In particular, the support based on carbon fibres is impregnated over all or part of its volume by at least one hydrophobic agent according to one of the embodiment variants described above.

The other constituents of the electrode incorporating a multilayer structure according to the invention, and of the PEMFC, are those conventionally used in fuel cells.

Typically, an electrode of a PEMFC according to the invention thus comprises the following assembly:
  optionally a current collector plate,
  a diffusion layer formed of a multilayer structure according to the invention; and
  an active layer (also referred to as catalyst layer).

At least one CNT mat of the multilayer structure according to the invention is positioned at the interface with the active layer, in other words in place of the microporous layer (MPL) of conventional electrode structures.

Within the context of a CNT multilayer structure having two CNT mats defining two opposite faces of said structure, one CNT mat also constitutes the interface of the diffusion layer with the current collector plate.

The current collector plates that flank the membrane-electrode assembly of the fuel cell core have, in addition to the current collector role, a fluid transport role, for the distribution of the reactants and the flow of the water or water vapour produced. These plates are generally graphite plates and the flow channels are obtained by machining.

The catalyst layer or active layer is porous, generally consisting of platinum nanoparticles that form the catalytic sites, supported by carbon aggregates.

A PEMFC fuel cell according to the invention comprises at least one electrode incorporating a diffusion layer according to the invention, preferably two electrodes, anode and cathode, each incorporating a diffusion layer according to the invention.

The two electrodes of a PEMFC flank a polymer electrolyte membrane, that enables the passage of the protons ($H^+$) but is impermeable to the reactants.

The arrangement and the preparation of the electrodes, and of a PEMFC fuel cell, incorporating one/some diffusion layer(s) according to the invention, of course fall under techniques that are known to a person skilled in the art.

More particularly, a membrane-electrode assembly of a PEMFC fuel cell according to the invention comprises at least the following sequence of layers, in that order:
- a support based on carbon fibres;
- a CNT mat according to the invention;
- the structure being formed of at least said support and said CNT mat constituting the layer called diffusion layer;
- an active layer; and
- a proton-conducting membrane.

The composite diffusion layer according to the invention may be incorporated into a membrane-electrode assembly in two ways, such as described by Liu et al. [6].

According to a first variant embodiment, an active layer can be manufactured or deposited on the diffusion layer according to the invention in order to obtain a gas diffusion electrode (GDE), the electrode being then assembled with a proton-conducting membrane.

More precisely, the active layer may be produced at the surface of the diffusion layer according to the invention by techniques that are known to person skilled in the art, typically by liquid route. As an example, it can be formed by deposition, for example by coating, screen-printing or spraying, on the diffusion layer of a dispersion of catalyst, such as platinum particles, and proton-conducting polymer (such as of perfluorosulfonated type as Nafion®), in one or more solvent(s) of water/alcohol type, followed by evaporation of the solvent(s).

The obtained GDE can then be assembled with the proton-conducting membrane by hot pressing, in particular by adjusting the temperature, strain and time of the hot pressing. For example, the assembly may be produced by pressing at 135° C. at 3.5 MPa for 3 minutes and 30 seconds.

The obtained GDE may be used as anode, as cathode or for both electrodes of a membrane-electrode assembly in a PEMFC.

According to a second variant embodiment, the diffusion layer according to the invention may be combined with an assembly comprising the membrane and at least one of the anode or cathode active layers, generally both active layers. This assembly is referred to as "CCM" for Catalyst Coated Membrane. The diffusion layer is then combined, by contact or by hot pressing, with the CCM in order to make the membrane-electrode assembly.

The invention will now be described by means of the following examples, given of course by way of nonlimiting illustration of the invention.

EXAMPLES

Example 1

Preparation of a Multilayer Structure According to the Invention 1.1. Formation of a CNT Mat on the Surface of a Support Based on Carbon Fibres A mat of carbon nanotubes is formed on one of the faces of a carbon paper, sold under the reference Toray TGP-H-030 that has not undergone a hydrophobic treatment, according to the following protocol.

Advantageously, the carbon paper may be treated thermally under air or a mixture 95 mol % of $N_2$/5 mol % of $H_2$, at 616° C. for 2 hours.

In a first step, a stack of thin layers comprising a layer of catalyst material is produced as follows on one of the faces of the paper based on carbon fibres.

Thin layers of iron (2 nm), of titanium (5 nm), of aluminium (2 nm) and of iron (1 nm) are deposited successively, in this order, on one of the faces of the carbon paper. The resulting stack is therefore of carbon paper/Fe/Ti/Al/Fe type.

The various layers of the stack are deposited under normal incidence by a physical vapour deposition (PVD) technique, using an electron gun at ambient temperature.

A CNT mat is then grown by a chemical vapour deposition (CVD) technique activated by hot filaments, also known under the acronym HFCVD for hot-filament chemical vapour deposition.

After vacuum pumping, the sample is raised in temperature to 450° C. over 12 minutes, under a pressure of 0.3 Torr of a $C_2H_2$/$H_2$/He gas mixture, with respective flow rates of 10, 55 and 110 sccm.

The flow rate unit, indicated by the acronym sccm for "standard cubic centimetres per minute", corresponds to the unit of a flow rate of one cubic centimetre per minute under 0° C. temperature conditions and 101 325 kPa pressure conditions.

The hot filaments composed of 6 carbon wires with a diameter of 0.5 mm are then switched on with a power of 500 W. The filaments operate at this power for 20 minutes.

After switching off the filaments, the heating is turned off and the drop in temperature takes place under helium at a pressure of 0.45 Torr.

At the end of this process, a CNT mat having a density of $10^{12}$ tubes/$cm^2$ is obtained on the carbon fibres. The CNTs have a mean unit diameter of around 5 nm and a length of around 10 μm.

Figure 7:
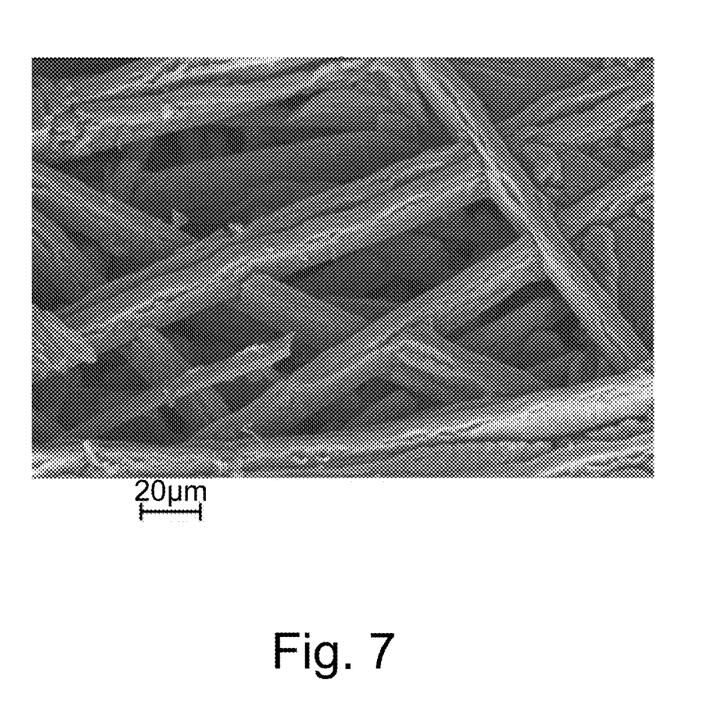
FIGS. 7 and 8 represent images, obtained by scanning electron microscopy (SEM), of the CNT mats obtained at the surface of the carbon fibres according to Example 1, using an Fe/Ti/Al/Fe (FIG. 7) and Ti/Al/Fe (FIG. 8) catalytic stack.

FIG. 7 represents an image, obtained by scanning electron microscopy, of the CNT mat obtained on the carbon fibres.

Figure 8:
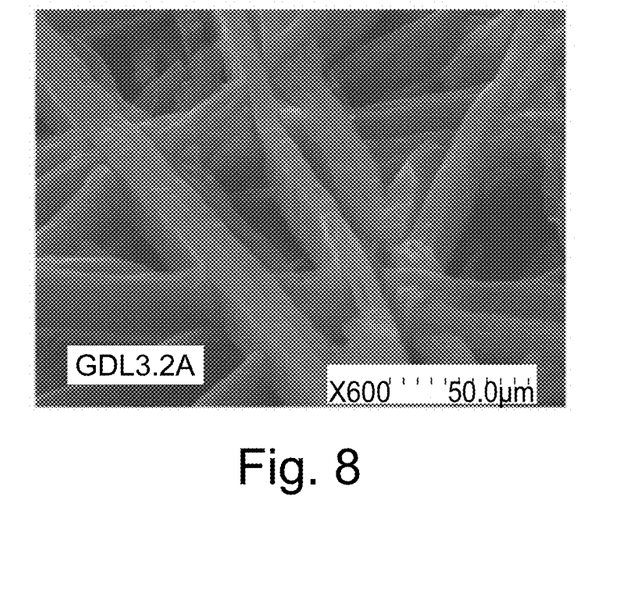

Alternatively, a CNT mat may be formed from the deposition of the catalyst stack of Ti/Al/Fe type (therefore in the absence of the first iron layer). Under these conditions, the CNT mat formed reaches a height of 20 μm by following the process described above and the density of the tubes is $2 \times 10^{11}$ tubes/$cm^2$. FIG. 8 represents an image, obtained by scanning electron microscopy, of the CNT mat obtained on the carbon fibres.

1.2. Deposition on a Substrate Based on Carbon Fibres that is Treated by a Hydrophobic Agent The layer based on carbon fibres at the surface of which a CNT mat is formed is then deposited on a Toray TGP-H-030 carbon paper pre-treated with 10% by weight of PTFE hydrophobic agent.

The multilayer structure thus formed is represented schematically in FIG. 2.

It may be used as diffusion layer in one or more electrode(s) of a conventional proton-exchange membrane fuel cell, by replacing the microporous layer (MPL) conventionally produced using carbon black, graphene or graphite, the CNT mat being positioned at the interface with the active layer.

Alternatively, the layer based on carbon fibres incorporating a CNT mat obtained as described above may then be deposited on a porous support based on carbon fibres, for example sold under the reference Freudenberg H14 or H15, pre-treated with 10% by weight of PTFE by impregnation.

Example 2

Preparation of a Multilayer Structure According to the Invention 1.1. Formation of a CNT Mat on the Surface of a Substrate Based on Carbon Fibres In a first step, a CNT mat is formed on one of the faces of a substrate based on carbon fibres, sold under the reference Toray TGP-H-090, according to the protocol described in Example 1 above.

1.2. Impregnation of the Substrate by a Hydrophobic Agent

In a second step, the substrate is impregnated over a thickness e extending from the face opposite the CNT mat and that is less than the total thickness of the substrate, by a hydrophobic agent (polytetrafluoroethylene, PTFE).

In order to do this, a 60 wt % aqueous suspension of PTFE is sprayed in order to obtain an impregnation of the substrate in a proportion of 5 to 10% by weight.

Alternatively, it is possible to use a suspension of PTFE by adding up to 50% by volume of ethanol, so as to have a better wettability of the substrate.

A heat treatment is then carried out, ideally under an inert atmosphere, at 360° C., for 5 minutes, in order to sinter the PTFE.

At the end of the hydrophobic treatment, the multilayer structure obtained, as represented in FIG. 6, may be used as diffusion layer in a conventional proton-exchange membrane fuel cell, by replacing the microporous layer (MPL), the CNT mat being positioned at the interface with the active layer.

According to a variant embodiment, the face opposite the CNT mat may be rendered hydrophobic via a plasma treatment carried out in a radiofrequency capacitively coupled plasma reactor under the following conditions: 100 sccm of $SF_6$ at 100 mTorr, with an RF power (13.56 MHz) of 100 W for 2 minutes.

Alternatively, the plasma treatment may be carried out in a radiofrequency inductively coupled plasma reactor under the following conditions: 100 sccm of $CF_4$ at 20 mTorr, with an RF power (13.56 MHz) of 500 W for 5 minutes.

Example 3

Performances of the PEMFCs Incorporating a Diffusion Layer According to the Invention 3.1. Preparation of the Diffusion Layers According to the Invention A first multilayer structure (A) according to the invention is prepared as described in Example 1.

The multilayer structure thus obtained, composed of two parts (carbon-based substrate/layer based on carbon fibres with CNT mat), is represented schematically in FIG. 2.

A second multilayer structure (B) according to the invention is prepared according to the same protocol as that of the first structure, except for the fact that two mats of nanotubes are formed on either side of the carbon-based support.

The multilayer structure obtained according to this variant, composed of three parts (layer based on carbon fibres/carbon-based substrate/layer based on carbon fibres/CNT mat) is represented schematically in FIG. 4.

3.2. Performances of the PEMFCs Incorporating the Mulitlayer Structures

The two multilayer structures obtained according to Example 3.1. are used as diffusion layers on the cathode of a conventional proton-exchange membrane fuel cell, by replacing the microporous layer (MPL), the CNT mat or one of the CNT mats being positioned at the interface with the active layer. The active layer of the cathode is based on platinum at 0.4 mg/cm$^2$.

The anode consists of a diffusion layer sold by the company SGL under the reference Sigracet 24BC. It is composed of a carbon paper impregnated with 10% by weight of PTFE covered by a microporous layer based on PTFE and on carbon black. The active layer of the anode is based on platinum at 0.1 mg/cm$^2$.

The electrodes are deposited on the membrane with a thickness of 18 μm.

Figure 9:
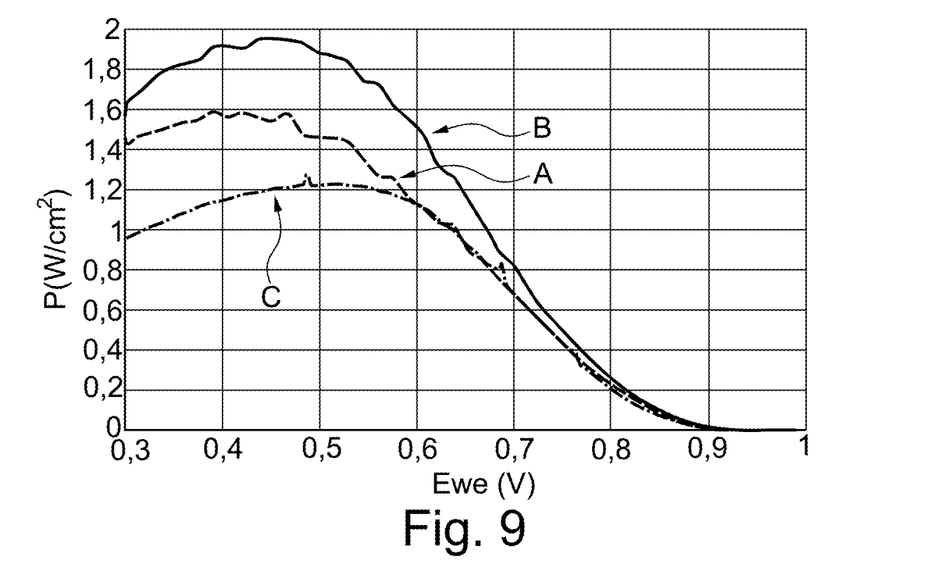
FIG. 9 represents the power-voltage curves, representative of the performances of the PEMFCs tested according to Example 3, incorporating various diffusion layers described in detail in Example 3 at the cathode.

The power-voltage curves, representative of the performances of the PEMFCs obtained with each of the multilayer structures (A) and (B) (conditioning and performances at 80° C.; 1.5 bar; $H_2$/air, 50% RH on each side), are represented in FIG. 9.

By way of comparison, the performances obtained using a conventional PEMFC (C), incorporating a diffusion layer of microporous nature, sold under the reference Sigracet 24BC by the company SGL, are represented. This diffusion layer is composed of carbon paper impregnated with 10% by weight of PTFE covered by a microporous layer based on PTFE and on carbon black.

The performances obtained using a diffusion layer according to the invention, according to one or the other of the variants described above, are significantly improved for current densities of greater than 1 A/cm$^2$.

REFERENCES

[1] Cho et al., Phys. Chem. Chem. Phys. 14, 2012, 4296-4302;
[2] Atiyeh et al., Journal of Power Sources 170 (2007), 111-121;
[3] Tang et al., Electrochimica Acta 56 (2011), 4327-4334;
[4] Xie et al., International Journal of Hydrogen Energy 40 (2015), 8958-8965;
[5] "Carbon Nanotubes—Synthesis, Characterization, Applications" Edited by Dr. Siva Yellampalli Jul. 20, 2011;
[6] Liu et al., Journal of Power Sources 220 (2012) 348e353.

The invention claimed is:

1. A multilayer structure, of use as composite diffusion layer in a proton-exchange membrane fuel cell, comprising at least one mat of carbon nanotubes having a unit diameter of less than or equal to 20 nm, defining at least one face of said structure, said mat of carbon nanotubes being superposed on a support based on carbon fibres, wherein the support based on carbon fibres is impregnated over part of its volume by at least one hydrophobic agent, and/or a face of the support opposite the CNT mat is hydrophobic or coated with a film incorporating at least one hydrophobic agent, wherein the interface between the support based on carbon fibres and the mat of carbon nanotubes which is superposed thereon comprises a stack of thin layers comprising, in this order, from the support up to the mat of nanotubes:

a/ optionally a metal layer made of metal M or layer made of metal alloy based on the metal M or layer made of graphene;
b/ a titanium layer;
c/ an aluminium layer;
d/ a layer of material(s) that catalyse(s) the growth of carbon nanotubes.

2. The multilayer structure according to claim 1, wherein the CNT mat has a density greater than or equal to $10^{11}$ CNT per cm$^2$.

3. The multilayer structure according to claim 1, wherein the CNT mat has a density between $10^{11}$ and $10^{13}$ CNT per cm$^2$.

4. The multilayer structure according to claim 1, wherein the CNT mat has a thickness between 1 and 200 µm.

5. The multilayer structure according to claim 1, wherein the CNT mat has a thickness between 5 and 100 µm.

6. The multilayer structure according to claim 1, wherein the CNT mat has a thickness between 5 and 50 µm.

7. The multilayer structure according to claim 1, wherein the support based on carbon fibres is impregnated over part of its volume by at least one hydrophobic agent, and/or has, on the face of the support opposite the CNT mat, a film incorporating at least one hydrophobic agent.

8. The multilayer structure according to claim 1, wherein said hydrophobic agent is selected from fluoropolymers and perfluoropolymers.

9. The multilayer structure according to claim 1, wherein said hydrophobic agent is selected from poly(vinylidene fluoride), polytetrafluoroethylene, fluorinated ethylene propylene, poly(vinylidene fluoride-co-hexafluoropropylene), poly(ethylene-co-tetrafluoroethylene) and perfluoroalkoxy.

10. The multilayer structure according to claim 1, comprising two CNT mats defining two opposite faces of said structure.

11. The multilayer structure according to claim 1, wherein the support based on carbon fibres comprises:
a substrate based on carbon fibres; and
a layer based on carbon fibres on at least one of the faces of said substrate, comprising less than 30% by weight of hydrophobic agent;
said layer having, on at least the face opposite said substrate, said mat of carbon nanotubes,
wherein the substrate based on carbon fibres is hydrophobic.

12. The multilayer structure according to claim 11, wherein the substrate based on carbon fibres is impregnated by at least one hydrophobic agent.

13. The multilayer structure according to claim 11, wherein said substrate has between 2% and 40% by weight of hydrophobic agent(s), relative to its total weight.

14. The multilayer structure according to claim 11, wherein the layer based on carbon fibres comprises less than 10% by weight of hydrophobic agent.

15. The multilayer structure according to claim 11, wherein the substrate is intercalated between two layers based on carbon fibres, comprising less than 30% by weight of hydrophobic agent, each of the layers having, on its face opposite said substrate, a CNT mat.

16. The multilayer structure according to claim 11, further comprising a mat of carbon nanotubes intercalated between at least one layer based on carbon fibres and said substrate.

17. The multilayer structure according to claim 11, wherein the layer based on carbon fibres borne by at least one of the faces of said substrate, comprises less than 10% by weight of hydrophobic agent.

18. The multilayer structure according to claim 11, wherein the layer based on carbon fibres borne by at least one of the faces of said substrate is free of hydrophobic agent.

19. The multilayer structure according to claim 1, wherein the support based on carbon fibres is formed of a solid substrate based on carbon fibres, said solid substrate having, on one of its faces, said mat of carbon nanotubes, wherein said substrate is impregnated, on the face opposite the CNT mat, by at least one hydrophobic agent, and/or the face opposite the CNT mat is hydrophobic or coated with a film comprising at least one hydrophobic agent.

20. The multilayer structure according to claim 19, having on each of the two opposite faces of said substrate, a mat of carbon nanotubes.

21. The multilayer structure according to claim 19, wherein said substrate is impregnated, on the face opposite the CNT mat, by at least one hydrophobic agent, and/or has, on the face opposite the CNT mat a film comprising at least one hydrophobic agent.

22. The multilayer structure according to claim 19, wherein the substrate is impregnated over a thickness, e, extending from the face opposite the CNT mat, that is less than the total thickness of the substrate.

23. The multilayer structure according to claim 19, wherein the substrate is impregnated over a thickness e representing less than 95% of the total thickness of the substrate.

24. The multilayer structure according to claim 19, wherein the substrate is impregnated over a thickness e representing less than 80% of the total thickness of the substrate.

25. An electrode for a proton-exchange membrane fuel cell, comprising a multilayer structure as defined according to claim 1, at least one CNT mat of said structure being positioned in contact with the active layer of the electrode.

26. A proton-exchange membrane fuel cell comprising at least one electrode comprising a multilayer structure as defined according to claim 1, at least one CNT mat of said structure being positioned in contact with the active layer of the electrode.

27. A process for preparing a multilayer structure, of use as composite diffusion layer in a proton-exchange membrane fuel cell, comprising at least the following steps:

(i) producing, on at least one of the faces of a support based on carbon fibres, comprising less than 30% by weight of hydrophobic agent, a catalytic stack of thin layers, comprising in this order:
a/ optionally a metal layer made of metal M or layer made of metal alloy based on the metal M or layer made of graphene;
b/ a titanium layer;
c/ an aluminium layer;
d/ a layer of material(s) that catalyse(s) the growth of carbon nanotubes; and (ii) growing a mat of carbon nanotubes on the stack according to a chemical vapour deposition technique, which is optionally plasma enhanced, and optionally hot-filament activated.

28. The process according to claim 27, wherein said support based on carbon fibres is submitted, prior to its use in step (i), to a heat treatment at a temperature of between 500° C. and 700° C., under an atmosphere of inert gas(es), air, hydrogen, oxygen, or a mixture of these gases.

29. The process according to claim 27, comprising at least the following steps:
   (a1) producing, according to steps (i) and (ii), a CNT mat on at least one of the faces of a support based on carbon fibres, comprising less than 30% by weight of hydrophobic agent(s); and
   (a2) depositing a support prepared according to step (a1) on at least one of the faces of a substrate based on carbon fibres, having previously undergone a hydrophobic treatment, at least one CNT mat being present on the face of the support opposite said substrate.

30. The process according to claim 27, comprising at least the following steps:
   (b1) producing, according to steps (i) and (ii), a CNT mat on at least one of the faces of a substrate based on carbon fibres, comprising less than 30% by weight of hydrophobic agent;
   and, in the case of forming a CNT mat on a single face of said substrate, optionally,
   (b2) hydrophobic treating the substrate on the face opposite the one supporting the CNT mat, said hydrophobic treatment being performed under conditions that are adjusted so as not to adversely affect the structure of the CNT mat formed in step (b1).

31. The process according to claim 30, wherein the hydrophobic treatment in step (b2) is carried out by impregnating the substrate, on the face opposite the one supporting the CNT mat, by at least one hydrophobic agent; forming on the face opposite the one supporting the CNT mat, a film comprising at least one hydrophobic agent and/or plasma treating with at least one fluorinated gas.

32. A process for forming an electrode of a proton-exchange membrane fuel cell, using a multilayer structure as defined according to claim 1, as a composite diffusion layer, at least one CNT mat of said structure being positioned in contact with the active layer of the electrode.

33. The process according to claim 32 for forming the cathode of a proton-exchange membrane fuel cell.

* * * * *